(12) United States Patent
Kieltyka et al.

(10) Patent No.: US 12,706,606 B2
(45) Date of Patent: Aug. 11, 2026

(54) TRIPLE MODULE REDUNDANT SOLID STATE POWER SWITCH

(71) Applicant: Blue Origin Manufacturing, LLC, Huntsville, AL (US)

(72) Inventors: Krzysztof Kieltyka, Enumclaw, WA (US); Drew Kelley, Renton, WA (US); Jacob Hoxsey Fenton, Gilbert, AZ (US); Hayden W. Wilhelm, Renton, WA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 0 days.

(21) Appl. No.: 18/965,889

(22) Filed: Dec. 2, 2024

(65) Prior Publication Data

US 2026/0155823 A1 Jun. 4, 2026

(51) Int. Cl.
*H03K 19/00* (2006.01)
*H03K 19/003* (2006.01)
*H03K 19/20* (2006.01)

(52) U.S. Cl.
CPC ... *H03K 19/0021* (2013.01); *H03K 19/00338* (2013.01); *H03K 19/20* (2013.01)

(58) Field of Classification Search
CPC ........... H03K 19/003; H03K 19/00315; H03K 19/0033; H03K 19/00338; H03K 19/20; H03K 19/23
See application file for complete search history.

(56) References Cited

U.S. PATENT DOCUMENTS

| | | | | |
|---|---|---|---|---|
| 9,893,723 | B1 * | 2/2018 | Garofalo | H03K 17/6874 |
| 11,349,474 | B1 * | 5/2022 | Yelamos Ruiz | G01R 19/145 |
| 11,848,673 | B1 * | 12/2023 | Grant | H03K 19/00392 |
| 12,218,497 | B1 * | 2/2025 | Pickrell | H02H 9/02 |
| 2002/0116683 | A1 * | 8/2002 | Mitra | G06F 11/184 714/E11.069 |
| 2014/0277802 | A1 * | 9/2014 | Tomas | G06F 1/28 700/292 |
| 2021/0279197 | A1 * | 9/2021 | Hamlyn | H10D 84/85 |
| 2021/0405720 | A1 * | 12/2021 | Scheel | G06F 1/263 |
| 2024/0063627 | A1 * | 2/2024 | Wu | H02H 3/087 |

OTHER PUBLICATIONS

Shernta, Samira Abu, and Ali A. Tamtum. "Using triple modular redundant (tmr) technique in critical systems operation." In Proc. 1st Conf. Eng. Sci. Technol, p. 53. 2018.

* cited by examiner

*Primary Examiner* — Jason M Crawford
(74) *Attorney, Agent, or Firm* — Summit Patents, PC

(57) ABSTRACT

Herein presented are systems and methods for majority-vote, single fault tolerant switching of a switch using an electrical circuit that involves power transistors that carry relatively large electrical currents through the switch. The number of power transistors in the circuit of a majority-vote, single fault tolerant power switch may be reduced to four, thus saving circuit board space and producing relatively less heat. This may be done by avoiding the use of a third electrical branch that is generally used for triple module redundant power switches. In cases where a power transistor is relatively large and produces a relatively large amount of heat, reducing the number of this type of circuit component in a switch circuit may provide benefits such as reduced circuit board footprint and reduced heat generation.

20 Claims, 2 Drawing Sheets

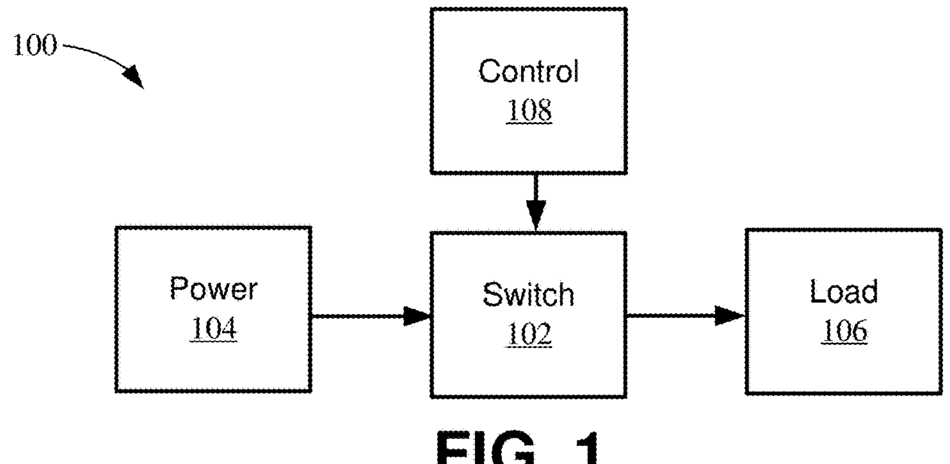
FIG. 1
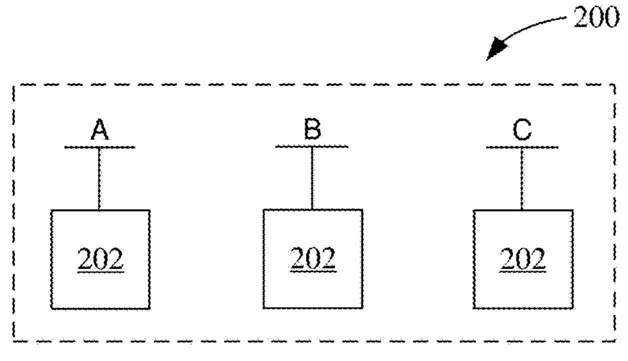
FIG. 2
| Input "on" | Status |
|---|---|
| A only | Off |
| B only | Off |
| C only | Off |
| A and B | On |
| A and C | On |
| B and C | On |
FIG. 3
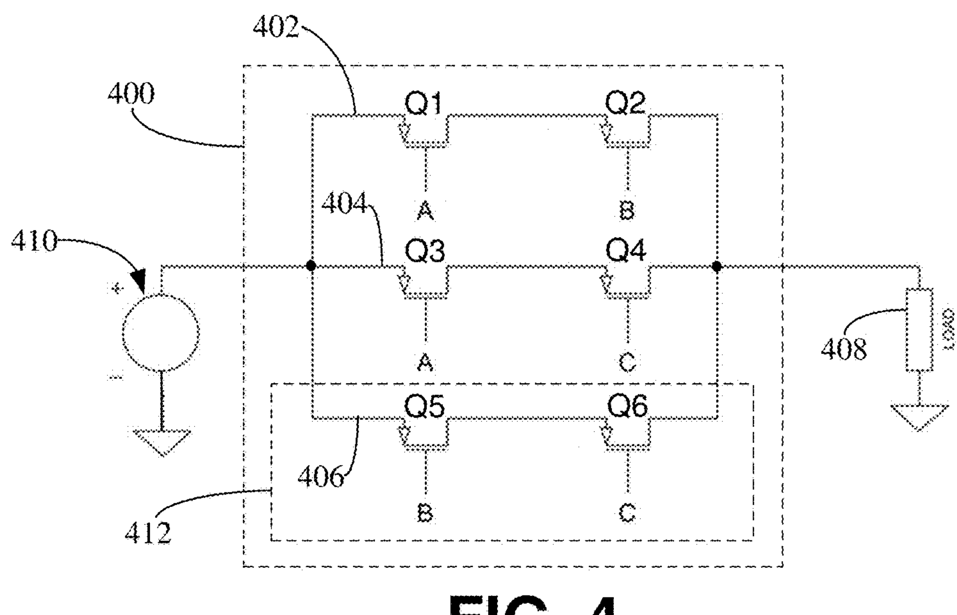
FIG. 4

TRIPLE MODULE REDUNDANT SOLID STATE POWER SWITCH

BACKGROUND

Many computing systems used in applications of critical systems utilize fault tolerance criteria to help ensure continuing operation. For example, operating in the presence of faults may be required in applications for safety and reliability such as in electric power distribution systems, telecommunications, medical life-support, nuclear reactor control, transportation, automotive, aircraft, and space vehicles. Such systems tend to require continuity and reliability of service. A technique for meeting reliability requirements may involve multiple modular redundancy, wherein switching is based on the majority voting of system output levels. For example, at least two out of three switches need to agree before an action is taken in triple modular redundancy switches. This technique generally provides i) enhanced safety by reducing the likelihood of a false trip, ii) assurance that the system remains operational even if one switch fails, and iii) fault tolerance, meaning that the system can handle a single failure without compromising overall functionality.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 is a block diagram of a system that incorporates a triple module redundant power switch, according to some embodiments.

FIG. 2 is a schematic of switch controllers that may be applied to a triple module redundant power switch, according to some embodiments.

FIG. 3 is a table of input control values and corresponding switch statuses, according to some embodiments.

FIG. 4 illustrates a circuit of a triple module redundant power switch, according to some embodiments.

DETAILED DESCRIPTION

Figure 5:
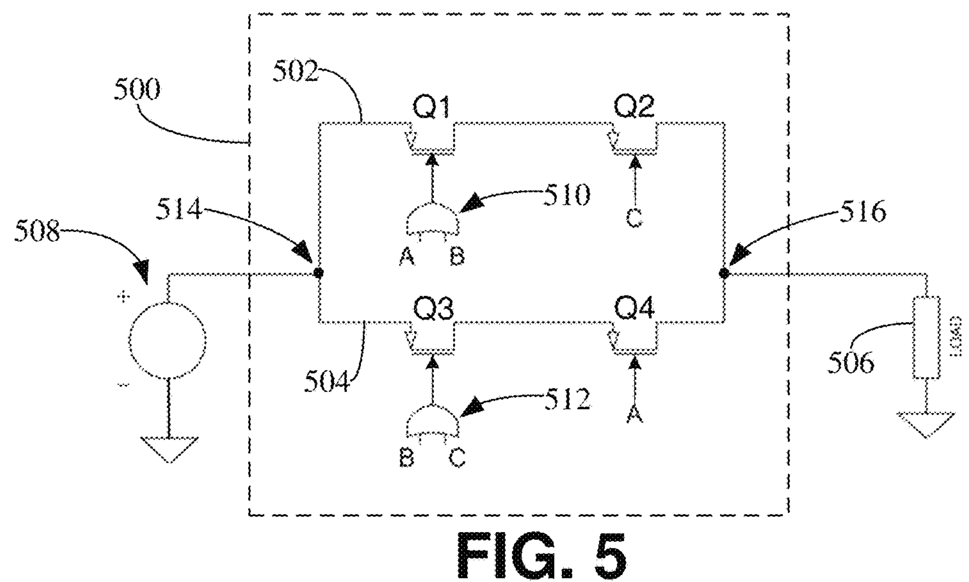
FIG. 5 illustrates a circuit of a triple module redundant power switch, according to other embodiments.

This disclosure describes, among other things, systems and methods for majority-vote, single fault tolerant switching of a switch using an electrical circuit that involves power FETs (field effect transistors) to carry relatively large electrical currents through the switch. For example, among other things, a power switch is described herein that uses power FETs arranged in such a way as to allow a switched output to be enabled, capable of carrying multiple amps of current from a power source, based on three independent sources of switch control. Accordingly, two of the three switch control inputs controlling the power switch must agree in order to transition an output state of the power switch. Other than FETs, the systems and methods described herein may also be applied to electrical circuits that include other types of transistors, such as those that carry relatively small electrical currents. Claimed subject matter is not limited in this respect.

For space applications, where electronic components and circuitry may be affected by radiation, three redundant sources of switch control may help to mitigate radiation-induced faults that cause unintended switch state changes, for example.

Generally, the amount of area on a circuit board occupied by a switching circuit, and the heat that it generates, may be particularly important in some applications. In the case of a circuit with power FETs that carry substantial electrical currents, reducing the size and the heat generated by the switching circuit may be a design problem that is solved by embodiments described herein. For example, the number of power FETs in the circuit of a majority-vote, single fault tolerant power switch may be reduced to four, thus saving circuit board space and producing relatively less heat. This may be done by avoiding the use of a third electrical branch that is generally used for triple module redundant power switches. Because a power FET is an electrical component that is relatively large and may produce a relatively large amount of heat, reducing the number of this type of component in a switch circuit may provide benefits such as reduced circuit board footprint and reduced heat generation.

The state (e.g., on or off) of a majority-vote, single fault tolerant power switch may be determined by two or three independent switch controllers, which each themselves may be considered to be in either an off-state or an on-state. For example, the states of any two of the three switch controllers need to agree with each other for the power switch to be on. If this is the case, then the state of the third switch controller is not important.

In some embodiments, an electrical circuit for such a majority-vote, single fault tolerant power switch may include a first switch controller and a second switch controller in an OR-configuration that is configured to control a first transistor (e.g., a power FET) in a first circuit branch. A third switch controller may be configured to control a second transistor in the first circuit branch. The second switch controller and the third switch controller may also be in an OR-configuration that is configured to control a first transistor in a second circuit branch, which is in parallel to the first circuit branch. The first switch controller may also be configured to control a second transistor in the second circuit branch. The single fault tolerant power switch may be in an on-state if at least any two of the first, second, and third switch controllers are in an on-state. The states of the first, the second, and the third switch controllers may be generated by a processor (e.g., an FPGA).

In some implementations, the first and the second circuit branches, the first switch controller and the second switch controller in the OR-configuration, and the second switch controller and the third switch controller in the OR-configuration are all on a single circuit board, which may be at least partially radiation-hardened, as explained below. In some implementations, the first and the second transistors in the first circuit branch and the first and the second transistors in the second circuit branch may each be P-channel power FETs.

In some implementations, the first switch controller and the second switch controller in the OR-configuration may comprise a first pair of transistors in parallel with each other. The voltage on the gate of each of the first pair of transistors may be controlled, respectively, by one of the first, the second, and the third switch controllers. Similarly, the second switch controller and the third switch controller in the OR-configuration may comprise a second pair of transistors in parallel with each other. The voltage on the gate of each of the second pair of transistors may be controlled, respectively, by one of the first, the second, and the third switch controllers.

In some embodiments, an electrical circuit for a majority-vote, single fault tolerant power switch may include a power source input node to provide voltage and current, a load output node to conditionally provide the voltage and the current to a load, a first branch connecting the power source input node to the load output node via a first transistor in series with a second transistor, and an output of a first OR-circuit to operate the gate of the first transistor. The output of the first OR-circuit may be based on an OR combination of A and B control inputs. The circuit further includes a C control input to operate the gate of the second transistor, a second branch connecting the power source input node to the load output node via a third transistor in series with a fourth transistor, and an output of a second OR-circuit to operate the gate of the third transistor. The output of the second OR-circuit may be based on an OR combination of the B and the C control inputs, the A control input may be configured to operate the gate of the fourth transistor, and the load output node may conditionally provide the voltage and the current to the load based on a majority of the A, B, and C control inputs being in an on-state.

In various implementations of the circuit, the first and the second OR-circuits, the first and the second branches, as well as the first, the second, the third, and the fourth transistors may all be on a single circuit board, which may be at least partially radiation-hardened. The first, the second, the third, and the fourth transistors may each be P-channel power FETs. The first and the second OR-circuits may each comprise two transistors in parallel with each other. The voltage on the gate of each of the two transistors may be controlled, respectively, by one of the A, B, or C control inputs, whose voltage values may be generated by a processor.

In some embodiments, a majority-vote, single fault tolerant power switch may comprise a first branch and a second branch, wherein the first branch may include a first transistor and a second transistor in series with the first transistor. The second branch, which is in parallel with the first branch, may include a third transistor and a fourth transistor in series with the third transistor. The power switch may further comprise an output of a first OR-circuit applied to the gate of the first transistor, an output of a second OR-circuit applied to the gate of the third transistor, a first switch control node applied to a first input of the first OR-circuit and to the gate of the fourth transistor, a second switch control node applied to a second input of the first OR-circuit and to a first input of the second OR-circuit, and a third switch control node applied to a second input of the second OR-circuit and to the gate of the second transistor. The power switch may be in an on-state if at least any two of the first, second, and third switch control nodes are in an on-state.

In various implementations, the first and the second OR-circuits, the first and the second branches, and the first, the second, the third, and the fourth transistors are all on a single circuit board. The single circuit board may be at least partially radiation-hardened. The first, the second, the third, and the fourth transistors may each be P-channel transistors, which may also be power FETs. A processor may generate signals to establish voltages levels for the first, second, and third switch control nodes. The first and the second OR-circuits may each comprise two transistors in parallel with each other. The voltage on the gate of each of the two transistors may be controlled, respectively, by one of the first, second, and third switch control nodes.

FIG. 1 is a block diagram of a system 100 that incorporates a triple module redundant power switch 102, according to some embodiments. A power switch 102 selectively controls the application of electrical power 104 to a load 106 based on signals generated by a control system 108, which may be an FPGA or a computer processor executing a set of machine-readable instructions, for example. Power switch 102 may be a majority-vote, single fault tolerant power switch. In some implementations, the power switch may be a triple module redundant power switch, wherein three independent switch controllers having respective voltage levels, are involved with determining whether or not the power switch is in an on-state or an off-state. Voltage levels of the three switch controllers may be generated, or be based on signals generated, by control system 108. Though a triple module configuration is described herein, claimed subject matter is not limited in this respect.

Load 106 may be any of a number of various types of circuits or devices, which may operate using a supplied (e.g., via switch 102) electrical current in the order of several amps or more. Accordingly, power switch 102 may be configured to carry such relatively high currents. Thus, in some implementations, power switch 102 may include power transistors that operate in their saturation region and are capable of carrying or blocking the large currents. For example, bipolar junction transistors (BJTs), metal oxide semiconductor field-effect transistors (MOSFETs), and insulated gate bipolar transistors (IGBTs) may be used as components that carry or block electrical current from power 104 to load 106.

FIG. 2 is a schematic of independent switch controllers 200 that may be applied to a triple module redundant power switch, such as 102, according to some embodiments. Switch controllers 200 may be generated by a control system 202, which may be the same as or similar to control system 108, that uses the power switch to either turn on or turn off at least some functionality of a load (e.g., 106). In this example, switch controllers 200 include switch controller A, switch controller B, and switch controller C.

FIG. 3 is a table of values of switch controllers A, B, and C and the switch statuses (e.g., of switch 102) resulting from the switch control values for a triple module, majority-vote, single fault tolerant power switch, according to some embodiments. The switch may be the same as or similar to 102, for example. If only one of A, B, and C is in an on-state, then the switch will be off. If two or more (e.g., a majority-vote) of A, B, and C are in an on-state, then the switch will be on.

To describe this functionality in terms of circuitry that controls the power switch, the following example is presented, wherein each switch controller A, B, and C is an electrical circuit that can produce its own on/off-state in response to some condition. Accordingly, if no switch controller circuit has failed, then all three circuits produce an output state that agrees with the other two output states, and this unanimity results in the power switch being in that output state. If one switch controller circuit fails, such as by failing to produce a voltage to operate the power switch, while the other two switch controller circuits are working correctly, the majority results in the power switch being in the state established by the two functioning switch controller circuits. If, however, two switch controller circuits fail, such as by failing to produce voltages to operate the power switch, while the third switch controller circuit is working correctly, the lack of a functioning majority results in no change of state of the power switch.

FIG. 4 illustrates a circuit of a triple module redundant power switch 400 having three parallel branches, according to some embodiments. For example, a first branch 402 includes transistors Q1 and Q2 in series, a second branch 404 includes transistors Q3 and Q4 in series, and a third branch 406 includes transistors Q5 and Q6 in series. The state (e.g., on or off) of power switch 400 may determine if a load 408 receives power (e.g., voltage and electrical current) from a power source 410. Transistors Q1-Q6 may be solid state power transistors configured in power switch 400 to operate in their respective saturation region (e.g., being operated as go, no-go switches). In this case, three switch control signals A, B, and C may be applied to the gates of the transistors.

Though power switch 400 provides the functionality of a majority-vote single fault tolerant power switch, based on the three switch control signals A, B, and C, the group 412 of circuit components that comprise third branch 406, and the concomitant switch control signals, may be eliminated in other embodiments of a power switch. Such elimination may allow for reducing the area of a circuit board occupied by the power switch and may result in less heat being produced.

FIG. 5 illustrates a circuit of a triple module redundant power switch 500 having two parallel branches, according to some embodiments. For example, a first branch 502 includes transistors Q1 and Q2 in series, and a second branch 504 includes transistors Q3 and Q4 in series. The state (e.g., on or off) of power switch 500 may determine if a load 506 receives power (e.g., voltage and electrical current) from a power source 508. Transistors Q1-Q4 may be solid state power transistors configured in power switch 500 to operate in their respective saturation region (e.g., being operated as go, no-go switches). In this case, three switch control signals A, B, and C may be applied to the gates of the transistors.

Interestingly, even though power switch 500 does not include a third branch (e.g., 406), power switch 500 may provide the same functionality as switch 400 of a majority-vote single fault tolerant power switch, based on the three switch control signals A, B, and C.

In some implementations, switch control signals A and B may be applied to an OR-circuit 510 and the output of the OR-circuit may in turn be applied to the gate of transistor Q1, as illustrated. Also, switch control signals B and C may be applied to an OR-circuit 512 and the output of the OR-circuit may in turn be applied to the gate of transistor Q3, as illustrated. In some implementations, OR-circuits 510 and 512 may instead be NOR-circuits and transistors Q1-Q4 may be N-type or P-type (N-type is illustrated merely as an example). Claimed subject matter is not limited to either case where a transistor is in an on-state if the gate is low or if the gate is high.

Transistors Q1-Q4 may be BJTs which, in general, can be used as a switch in their saturation region of operation. For example, BJTs may be used to control the amount of current flow as well as to establish switch-on/off-states. Transistors Q1-Q4 may also be MOSFETs, which include a source, base (e.g., gate), and drain terminals. Among still other examples, transistors Q1-Q4 may be IGBTs, which are generally used in medium to high-power circuits. An IGBT typically works in the saturation region during a normal ON state.

In some embodiments, power switch 500 includes a power source input node 514 to provide voltage and current to the power switch and, depending on the state of the power switch, to load 506. Power switch 500 also includes a load output node 516 to conditionally provide the voltage and the current to load 506. Power switch 500 also includes first branch 502 connecting power source input node 514 to load output node 516 via first transistor Q1 in series with second transistor Q2. An output of OR-circuit 510 operates the gate (or base) of first transistor Q1, wherein the output of the first OR-circuit may be based on an OR combination of A and B control inputs. C control input operates the gate of second transistor Q2. Herein, an input that "operates" or is "applied to" a gate (or base) of a transistor means that the input is electrically connected to the gate in such a way as to affect the state or operation of the transistor by the voltage of the input. In some implementations, the order of Q1 and Q2 in series may not be reversed without introducing detrimental transient effects based on parasitic capacitances, for example.

Power switch 500 may further include second branch 504 connecting power source input node 514 to load output node 516 via third transistor Q3 in series with fourth transistor Q4. An output of OR-circuit 512 operates the gate of third transistor Q3. The output of OR-circuit 512 may be based on an OR combination of the B and the C control inputs. The A control input may be configured to operate the gate of fourth transistor Q4. Load output node 516 may conditionally provide the voltage and the current from power source 508 to load 506 based on a majority of the A, B, and C control inputs being in an on-state. In some implementations, the order of Q3 and Q4 in series may not be reversed without introducing detrimental transient effects based on parasitic capacitances, for example.

First and second OR-circuits 510 and 512, first and second branches 502 and 504, and transistors Q1-Q4 may all be on a single circuit board, which may be at least partially radiation-hardened. For example, since most semiconductor electronic components may normally be susceptible to radiation damage, radiation-hardened components are generally available and may be used in the circuit board. Radiation hardening is a process of making electronic components and circuits resistant to damage or malfunction caused by relatively high levels of ionizing radiation (e.g., particle radiation and high-energy electromagnetic radiation), especially for environments in space (e.g., beyond low-Earth orbit). Due to the extensive development and testing often required to produce a radiation-tolerant design of a microelectronic chip, the technology of radiation-hardened chips tends to lag behind more recent developments in electronics and associated applications. Among the many types of circuit components, silicon carbide (SIC) MOSFETs are among the few that are naturally resistant to radiation damage. To take advantage of SiC MOSFETs being tolerant to radiation, and thus being able to be used in space applications, in some embodiments, Q1-Q4 may be SiC MOSFETs.

In other embodiments, Q1-Q4 may be P-channel transistor devices for at least the reason that P-channel transistors may have greater immunity to radiation as compared to N-channel transistors. For example, the mobility of holes (charge carriers in P-channel devices) is generally less than that of electrons (charge carriers in N-channel devices). This could potentially make P-channel devices less susceptible to radiation-induced disruptions.

Figure 6:
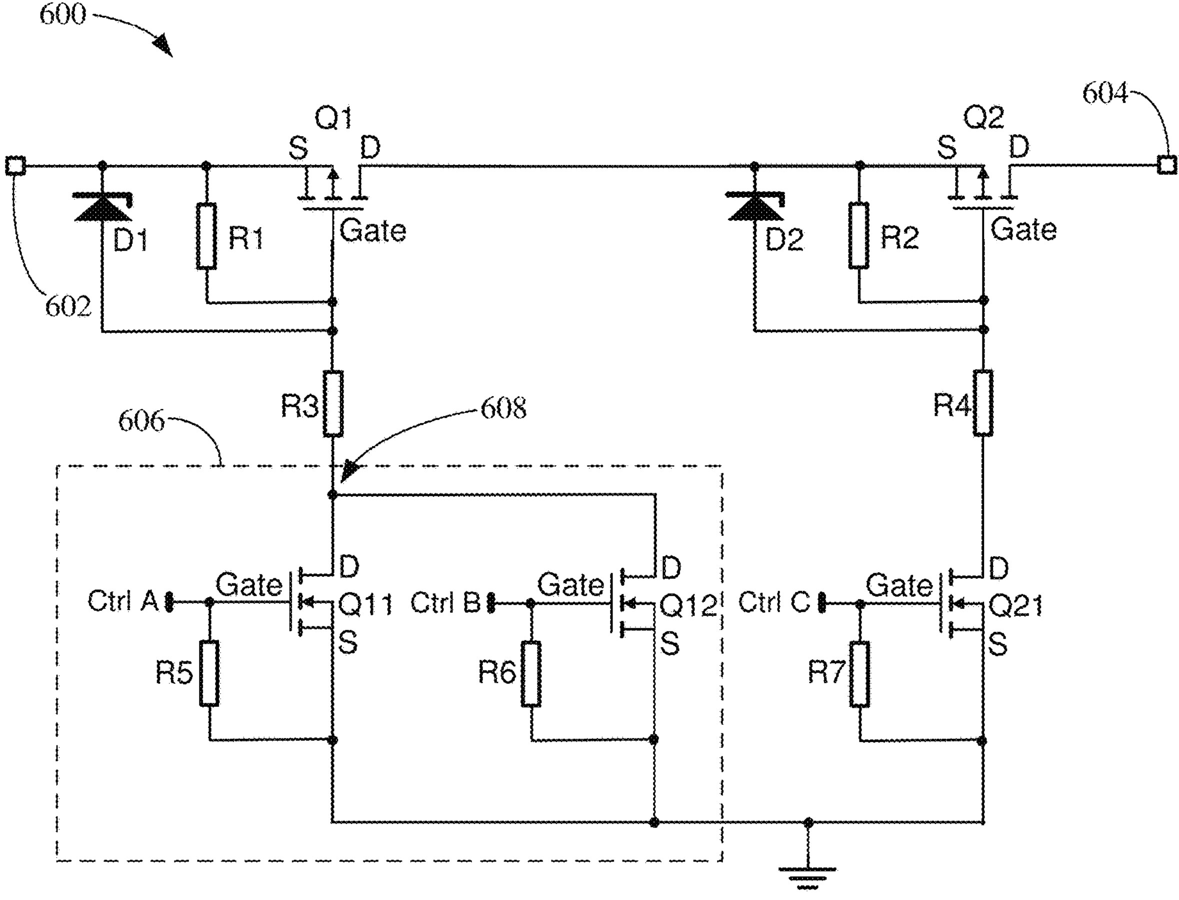
FIG. 6 illustrates a circuit of a branch of a triple module redundant power switch, according to some embodiments.

FIG. 6 illustrates a circuit 600 of a branch of a triple module redundant power switch, according to some embodiments. For example, circuit 600 may be first branch 502 that includes transistors Q1 and Q2, OR-circuit 510, and switch control signals A, B, and C. Circuit 600 further includes a power source input node 602, (e.g., 514), which may be tied to a power source, and a load output node 604 (e.g., 516), which may be tied to a load. A portion 606 may be the same as or similar to switch control signals A and B applied to OR-circuit 510. For example, the output 608 of circuit portion 606 (e.g., the output of the OR-circuit) may be applied to the gate of transistor Q1, as illustrated.

Circuit portion 606 may act as an OR-circuit because the gate voltage (e.g., output 608) of Q1 may follow the voltage on the drains (D) of Q11 and Q12, which is based on an OR combination of switch control signals A and B. The gate voltage of Q2 may follow the voltage on the drain of Q21, which is based on switch control signal C. Zener diodes D1 and D2 and resistors R1-R7 may have values that are selected based, at least in part, on properties of Q1, Q2, Q11, Q12, and Q21. For example, in some implementations, Q1 and Q2 may be P-type JFETs (or other type of power transistor) and Q11, Q12, and Q21 may be N-type MOSFETS, though claimed subject matter is not limited in this respect.

The foregoing description, for purposes of explanation, uses specific nomenclature to provide a thorough understanding of the disclosure. It will be apparent to one skilled in the art, however, that specific details are not required in order to practice the systems and methods described herein. The foregoing descriptions of specific embodiments or examples are presented by way of examples for purposes of illustration and description. They are not intended to be exhaustive of or to limit this disclosure to the precise forms described. Many modifications and variations are possible in view of the above teachings. The embodiments or examples are illustrated and described to best explain the principles of this disclosure and practical applications, to thereby enable others skilled in the art to best utilize this disclosure and various embodiments or examples with various modifications as are suited to the particular use contemplated. It is intended that the scope of this disclosure be defined by the following claims and their equivalents.

We claim as follows:

1. An electrical circuit for a majority-vote, single fault tolerant power switch, the electrical circuit comprising:

a power source input node to provide voltage and current;

a load output node to conditionally provide the voltage and the current to a load;

a first branch connecting the power source input node to the load output node via a first transistor in series with a second transistor;

an output of a first OR-circuit to operate the gate of the first transistor, wherein the output of the first OR-circuit is based on an OR combination of A and B control inputs;

a C control input to operate the gate of the second transistor;

a second branch connecting the power source input node to the load output node via a third transistor in series with a fourth transistor; and an output of a second OR-circuit to operate the gate of the third transistor, wherein the output of the second OR-circuit is based on an OR combination of the B and the C control inputs, the A control input is configured to operate the gate of the fourth transistor, and the load output node conditionally provides the voltage and the current to the load based on a majority of the A, B, and C control inputs being in an on-state.

2. The electrical circuit of claim 1, wherein the first and the second OR-circuits, the first and the second branches, the first, the second, the third, and the fourth transistors are all on a single circuit board.

3. The electrical circuit of claim 2, wherein the single circuit board is at least partially radiation-hardened.

4. The electrical circuit of claim 1, wherein the first, the second, the third, and the fourth transistors are each SiC MOSFETs.

5. The electrical circuit of claim 1, wherein the first, the second, the third, and the fourth transistors are each power FETs.

6. The electrical circuit of claim 1, wherein states of the A, B, and C control inputs are generated by a processor.

7. The electrical circuit of claim 6, wherein the first and the second OR-circuits each comprise two transistors in parallel with each other, and wherein voltage on the gate of each of the two transistors is controlled, respectively, by one of the A, B, or C control inputs generated by the processor.

8. A majority-vote, single fault tolerant power switch comprising:

a first branch including a first transistor and a second transistor in series with the first transistor;

a second branch in parallel with the first branch and including a third transistor and a fourth transistor in series with the third transistor;

an output of a first OR-circuit applied to the gate of the first transistor;

an output of a second OR-circuit applied to the gate of the third transistor;

a first switch control node applied to a first input of the first OR-circuit and to the gate of the fourth transistor;

a second switch control node applied to a second input of the first OR-circuit and to a first input of the second OR-circuit; and a third switch control node applied to a second input of the second OR-circuit and to the gate of the second transistor, wherein the power switch is in an on-state if at least any two of the first, second, and third switch control nodes are in an on-state.

9. The power switch of claim 8, wherein the first and the second OR-circuits, the first and the second branches, the first, the second, the third, and the fourth transistors are all on a single circuit board.

10. The power switch of claim 9, wherein the single circuit board is at least partially radiation-hardened.

11. The power switch of claim 8, wherein the first, the second, the third, and the fourth transistors are each SiC MOSFETs.

12. The power switch of claim 8, wherein the first, the second, the third, and the fourth transistors are each P-channel power FETs.

13. The power switch of claim 8, wherein a processor generates signals to establish voltages levels for the first, second, and third switch control nodes.

14. The power switch of claim 8, wherein the first and the second OR-circuits each comprise two transistors in parallel with each other, and wherein voltage on the gate of each of the two transistors is controlled, respectively, by one of the first, second, and third switch control nodes.

15. A single fault tolerant power switch operated by a majority-vote of three switch controllers, the single fault tolerant power switch comprising:

a first switch controller and a second switch controller in an OR-configuration configured to control a first transistor in a first circuit branch;

a third switch controller configured to control a second transistor in the first circuit branch;

the second switch controller and the third switch controller in an OR-configuration configured to control a first transistor in a second circuit branch that is in parallel to the first circuit branch; and the first switch controller configured to control a second transistor in the second circuit branch, wherein the single fault tolerant power switch is in an on-state if at least any two of the first, second, and third switch controllers are in an on-state.

16. The single fault tolerant power switch of claim 15, wherein the first and the second circuit branches, the first switch controller and the second switch controller in the OR-configuration, and the second switch controller and the third switch controller in the OR-configuration are all on a single circuit board.

17. The single fault tolerant power switch of claim 16, wherein the single circuit board is at least partially radiation-hardened.

18. The single fault tolerant power switch of claim 15, wherein the first and the second transistors in the first circuit branch and the first and the second transistors in the second circuit branch are each P-channel power FETs.

19. The single fault tolerant power switch of claim 15, wherein states of the first, the second, and the third switch controllers are generated by a processor.

20. The single fault tolerant power switch of claim 15, wherein the first switch controller and the second switch controller in the OR-configuration comprise a first pair of transistors in parallel with each other, voltage on the gate of each of the first pair of transistors is controlled, respectively, by one of the first, the second, and the third switch controllers, the second switch controller and the third switch controller in the OR-configuration comprise a second pair of transistors in parallel with each other, and voltage on the gate of each of the second pair of transistors is controlled, respectively, by one of the first, the second, and the third switch controllers.

* * * * *